US009851406B2

United States Patent
Ohta

(10) Patent No.: US 9,851,406 B2
(45) Date of Patent: Dec. 26, 2017

(54) CONTACTOR FAILURE DETERMINING METHOD AND CONTACTOR FAILURE DETERMINING DEVICE

(71) Applicant: MITSUBISHI JIDOSHA KOGYO KABUSHIKI KAISHA, Tokyo (JP)

(72) Inventor: Jinichi Ohta, Nagoya (JP)

(73) Assignee: MITSUBISHI JIDOSHA KOGYO KABUSHIKI KAISHA, Tokyo (JP)

( * ) Notice: Subject to any disclaimer, the term of this patent is extended or adjusted under 35 U.S.C. 154(b) by 116 days.

(21) Appl. No.: 14/947,414

(22) Filed: Nov. 20, 2015

(65) Prior Publication Data

US 2016/0146901 A1    May 26, 2016

(30) Foreign Application Priority Data

Nov. 21, 2014 (JP) .................................. 2014-236203

(51) Int. Cl.
*G01R 31/04* (2006.01)
*G01R 31/327* (2006.01)
*G01R 31/00* (2006.01)

(52) U.S. Cl.
CPC ........ *G01R 31/3278* (2013.01); *G01R 31/006* (2013.01)

(58) Field of Classification Search
CPC .... G01R 31/006; G01R 31/04; G01R 31/005; G01R 31/043; G01R 31/007; G01R 31/3696; G01R 31/3644; G01R 31/3658; G01R 31/362; B60L 3/00; B60L 3/12; B60L 3/0046; H02M 7/00; H02M 7/48
See application file for complete search history.

(56) References Cited

U.S. PATENT DOCUMENTS

| 2007/0221627 A1* | 9/2007 | Yugou | H01H 47/002 |
| | | | 218/136 |
| 2011/0049977 A1* | 3/2011 | Onnerud | B60L 3/0046 |
| | | | 307/9.1 |
| 2011/0084704 A1* | 4/2011 | Myoen | B60L 3/12 |
| | | | 324/538 |
| 2015/0060423 A1* | 3/2015 | Tanaka | B23K 9/0671 |
| | | | 219/130.01 |
| 2015/0276842 A1* | 10/2015 | Chang | G01R 31/005 |
| | | | 324/503 |

FOREIGN PATENT DOCUMENTS

JP    2013-169087 A    8/2013

* cited by examiner

*Primary Examiner* — Minh N Tang
(74) *Attorney, Agent, or Firm* — Birch, Stewart, Kolasch & Birch, LLP

(57) ABSTRACT

A contactor failure determining method in includes outputting a control signal for switching a positive-side contactor provided between a positive electrode of a multi-cell battery and a positive electrode of a load to which the multi-cell battery supplies electric power to an open state from a state in which a control signal for controlling the positive-side contactor and a negative-side contactor provided between a negative electrode of the multi-cell battery and a negative electrode of the load to a closed state and a precharge contactor provided between the multi-cell battery and the load to an open state is output, and as a first fixing determining step, determining a presence of fixing of the precharge contactor based on a degree of voltage drop of a voltage applied to the load after the control signal for switching the positive-side contactor to the open state is output.

8 Claims, 11 Drawing Sheets

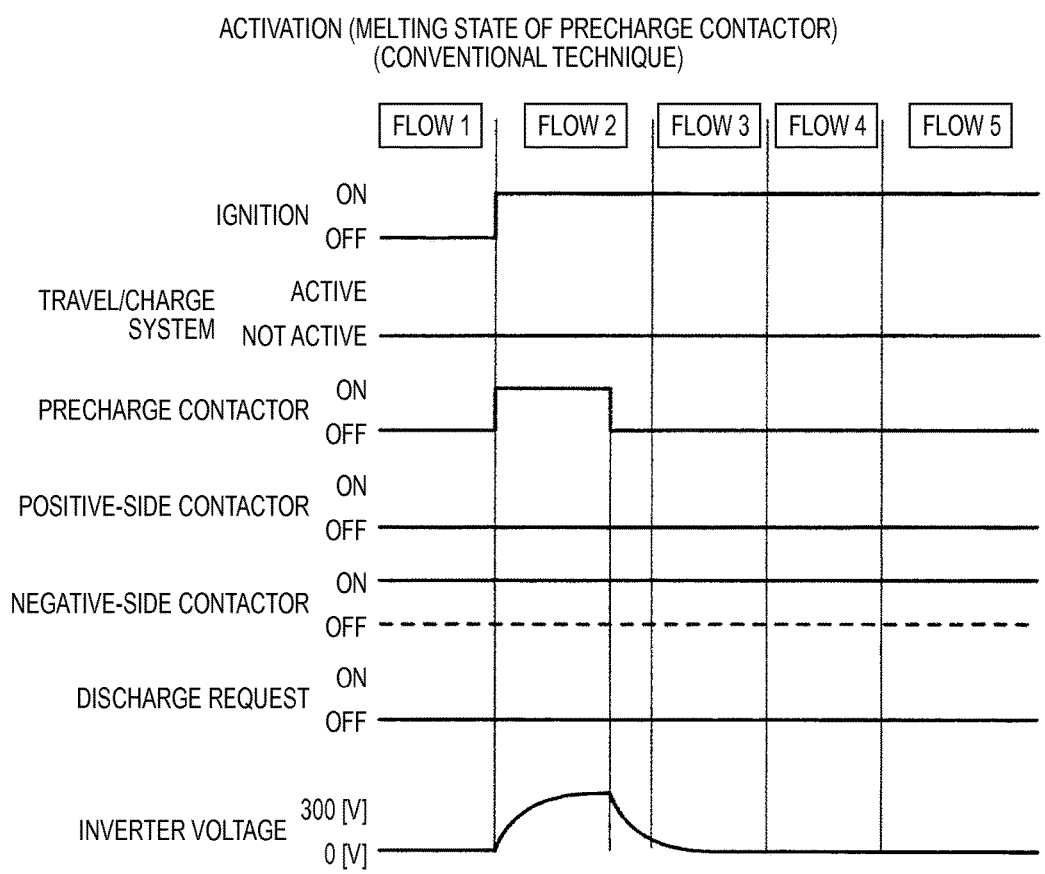

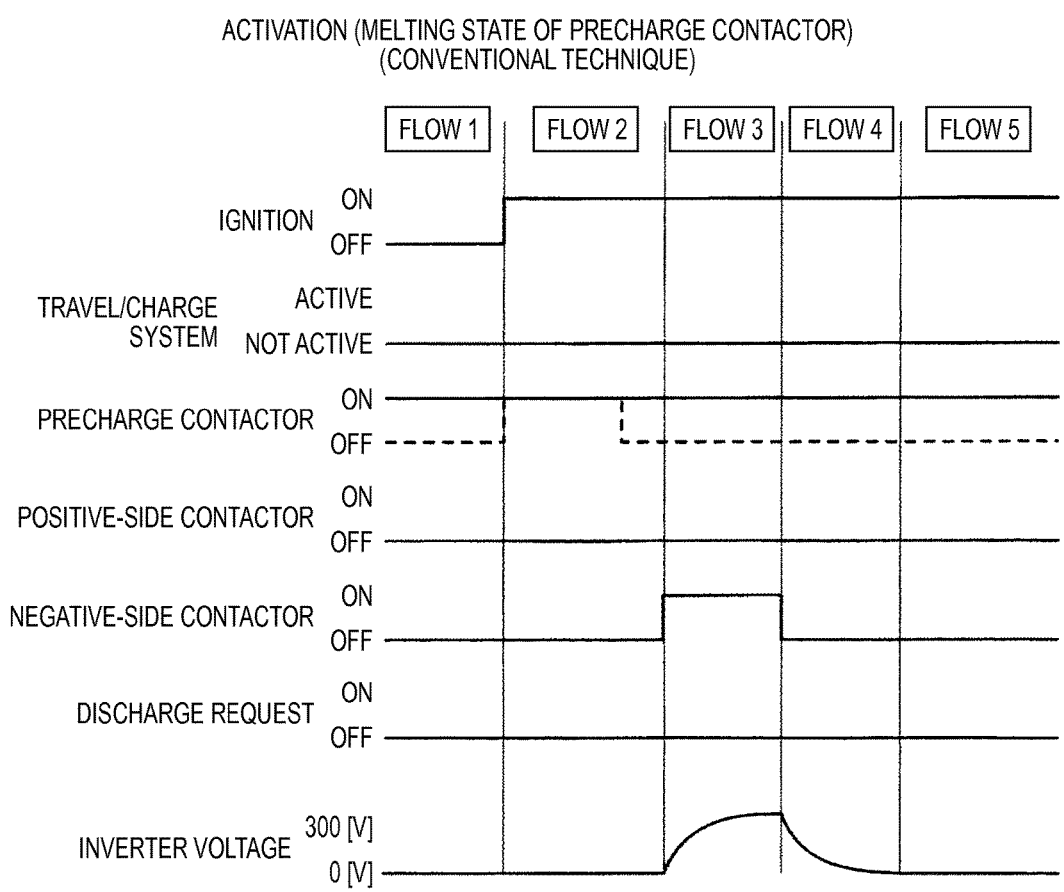

CONTACTOR FAILURE DETERMINING METHOD AND CONTACTOR FAILURE DETERMINING DEVICE

CROSS REFERENCE TO RELATED APPLICATION

This application is based on Japanese Patent Application No. 2014-236203 filed on Nov. 21, 2014, the contents of which are incorporated herein by reference.

BACKGROUND

1. Technical Field

The present invention relates to a contactor failure determining method and a contactor failure determining device for determining failures in a contactor in a battery pack.

2. Related Art

In the related art, in a battery pack mounted on an electric vehicle such as an electric car or a hybrid car, contactors (a positive-side contactor and a negative-side contactor) are provided between a multi-cell battery and terminals of the battery pack in order to isolate the multi-cell battery which is a high-voltage power supply from the outside when an unexpected event such as an accident occurs.

Moreover, a precharge contactor is provided in the battery pack in parallel to the positive-side contactor so as to suppress an inrush current at the activation of a high-voltage power supply.

The contactors are safety mechanisms of a battery pack and it is necessary to periodically check whether these contactors operate properly. Thus, the contactor is opened and closed at the activation (the start of supply of high-voltage power) and the deactivation (the end of supply of high-voltage power) of an electric vehicle to determine whether a failure has occurred in the contactor. The reason why contactor failures are determined at the activation and the deactivation of the electric vehicle is that since it is not possible to open and close the contactor during traveling of the electric vehicle, it is necessary to stably input and output power to a load during traveling (during the use of high-voltage power) of the electric vehicle.

For example, JP-A-2013-169087 below discloses a technique of diagnosing abnormalities by melting and fixing in a negative-side contactor and a precharge contactor at the timing of outputting an activation command for activating a vehicle to a positive-side contactor, the negative-side contactor, and the precharge contactor and diagnosing abnormalities by melting and fixing in the positive-side contactor at the timing of outputting a deactivation command for stopping the vehicle.

When contactor failure determination is performed at the activation and deactivation of an electric vehicle as in the conventional technique, a driver may experience inconvenience because activation and deactivation of the electric vehicle takes a longer period than gasoline vehicles.

Thus, failures in the contactors are preferably determined as quickly as possible.

The present invention has been made in view of such a problem and an object thereof is to provide a contactor failure determining method and a contactor failure determining device capable of determining failures in contactors quickly.

SUMMARY OF THE INVENTION (1) According to an aspect of the invention, a contactor failure determining method in a multi-cell battery includes:
outputting a control signal for switching a positive-side contactor provided between a positive electrode of the multi-cell battery and a positive electrode of a load to which the multi-cell battery supplies electric power to an open state at the end of supply of high-voltage power from a state in which a control signal for controlling the positive-side contactor and a negative-side contactor provided between a negative electrode of the multi-cell battery and a negative electrode of the load to a closed state and a precharge contactor provided between the multi-cell battery and the load to an open state is output; and
as a first fixing determining step, determining a presence of fixing of the precharge contactor based on a degree of voltage drop of a voltage applied to the load after the control signal for switching the positive-side contactor to the open state is output.

(2). In the contactor failure determining method according to (1), in the first fixing determining step, it is determined that the precharge contactor fixes in the closed state when a voltage drop amount per unit period of the load after the control signal for switching the positive-side contactor to the open state is output is equal to or larger than a first predetermined value and is smaller than a second predetermined value which is larger than the first predetermined value.

(3). In the contactor failure determining method according to (1), in the first fixing determining step, it is determined that the precharge contactor fixes in the closed state when a voltage drop amount of the load after elapse of a predetermined period after the control signal for switching the positive-side contactor to the open state is output is equal to or larger than a third predetermined value and is smaller than a fourth predetermined value which is larger than the third predetermined value.

(4). In the contactor failure determining method according to (2), in the first fixing determining step, it is determined that the precharge contactor is fixed in the closed state when a voltage drop amount of the load after the elapse of a predetermined period after the control signal for switching the positive-side contactor to the open state is output is equal to or larger than a third predetermined value and is smaller than a fourth predetermined value which is larger than the third predetermined value.

(5). In the contactor failure determining method according to (1), the first fixing determining step further includes determining a presence of fixing of the positive-side contactor as well as the presence of fixing of the precharge contactor based on a degree of voltage drop of the voltage applied to the load after the control signal for switching the positive-side contactor to the open state is output.

(6). In the contactor failure determining method according to (4), the first fixing determining step includes determining that the positive-side contactor fixes in a closed state when the voltage drop amount per unit period after the control signal for switching the positive-side contactor to the open state is output is smaller than a fifth predetermined value or when the voltage drop amount of the load after elapse of the predetermined period after the control signal for switching the positive-side contactor to the open state is output is smaller than a sixth predetermined value.

(7). In the contactor failure determining method according to (4), the first fixing determining step further includes:
determining the presence of fixing of the positive-side contactor as well as the presence of fixing of the precharge contactor based on a degree of voltage drop of the voltage applied to the load after the control signal for switching the positive-side contactor to the open state is output; and
determining that the positive-side contactor melts and fixes in the closed state when the voltage drop amount per unit period after the control signal for switching the positive-side contactor to the open state is output is smaller than the first predetermined value or when the voltage drop amount of the load after the elapse of the predetermined period after the control signal for switching the positive-side contactor to the open state is output is smaller than the third predetermined value.

(8). The contactor failure determining method according to (1) further includes:

as a second fixing determining step, determining a presence of fixing of the negative-side contactor only is determined based on a degree of voltage rise in the load after the control signal for switching the precharge contactor to a closed state is output from a state in which a control signal for switching the positive-side contactor, the precharge contactor, and the negative-side contactor to an open state at the start of supply of high-voltage power.

(9). In the contactor failure determining method according to (2), a plurality of loads are connected to the multi-cell battery, and the first fixing determining step includes setting the first and second predetermined values to values smaller than those when a failure is not detected in the load, when the failure is detected in at least one of the plurality of loads.

(10). In the contactor failure determining method according to (3), a plurality of loads are connected to the multi-cell battery, and the first fixing determining step includes setting the third and fourth predetermined values to values smaller than those when a failure is not detected in the load, when the failure is detected in at least one of the plurality of loads.

(11). In the contactor failure determining method according to (6), a plurality of loads are connected to the multi-cell battery, and the first fixing determining step includes setting the fifth and sixth predetermined values to values smaller than those when a failure is not detected in the load, when the failure is detected in at least one of the plurality of loads.

(12). According to another aspect on the invention, a contactor failure determining method in a multi-cell battery includes:

outputting a control signal for switching a positive-side contactor provided between a positive electrode of the multi-cell battery and a positive electrode of a load to which the multi-cell battery supplies electric power to an open state at the end of supply of high-voltage power from a state in which a control signal for controlling the positive-side contactor and a negative-side contactor provided between a negative electrode of the multi-cell battery and a negative electrode of the load to a closed state and a precharge contactor provided between the multi-cell battery and the load to an open state is output; and determining a presence of fixing of the precharge contactor and the positive-side contactor based on a degree of voltage drop of a voltage applied to the load after the control signal for switching the positive-side contactor to the open state is output;

outputting a control signal for switching the negative-side contactor to an open state;

outputting a control signal for switching the precharge contactor to a closed state from a state in which a control signal for controlling the positive-side contactor, the precharge contactor, and the negative-side contactor to the open state is output at the start of supply of high-voltage power;

determining a presence of fixing of the negative-side contactor based on a degree of voltage rise of the voltage applied to the load after the control signal for switching the precharge contactor to the closed state is output; and outputting a control signal for switching the precharge contactor to an open state after the control signal for switching the positive-side contactor to a closed state is output.

(13). According to another aspect of the invention, a contactor failure determining device includes:

a contactor control unit that outputs a control signal for switching a positive-side contactor provided between a positive electrode of the multi-cell battery and a positive electrode of a load to which the multi-cell battery supplies electric power to an open state at the end of supply of high-voltage power from a state in which a control signal for controlling the positive-side contactor and a negative-side contactor provided between a negative electrode of the multi-cell battery and a negative electrode of the load to a closed state and a precharge contactor provided between the multi-cell battery and the load to an open state is output; and a determination unit that determines a presence of fixing of the precharge contactor based on a degree of voltage drop of a voltage applied to the load after the control signal for switching the positive-side contactor to the open state is output.

BRIEF DESCRIPTION OF THE DRAWINGS

FIG. 10 is a timing chart illustrating a failure determining process at the start of supply of high-voltage power according to the conventional technique.

FIG. 11 is a timing chart illustrating a failure determining process at the start of supply of high-voltage power according to the conventional technique.

DESCRIPTION OF PREFERRED EMBODIMENT

Hereinafter, preferred embodiments of a contactor failure determining method and a contactor failure determining device according to the present invention will be described in detail with reference to the accompanying drawings.

Embodiment 1

Configuration of Contactor Failure Determining Device

Figure 1:
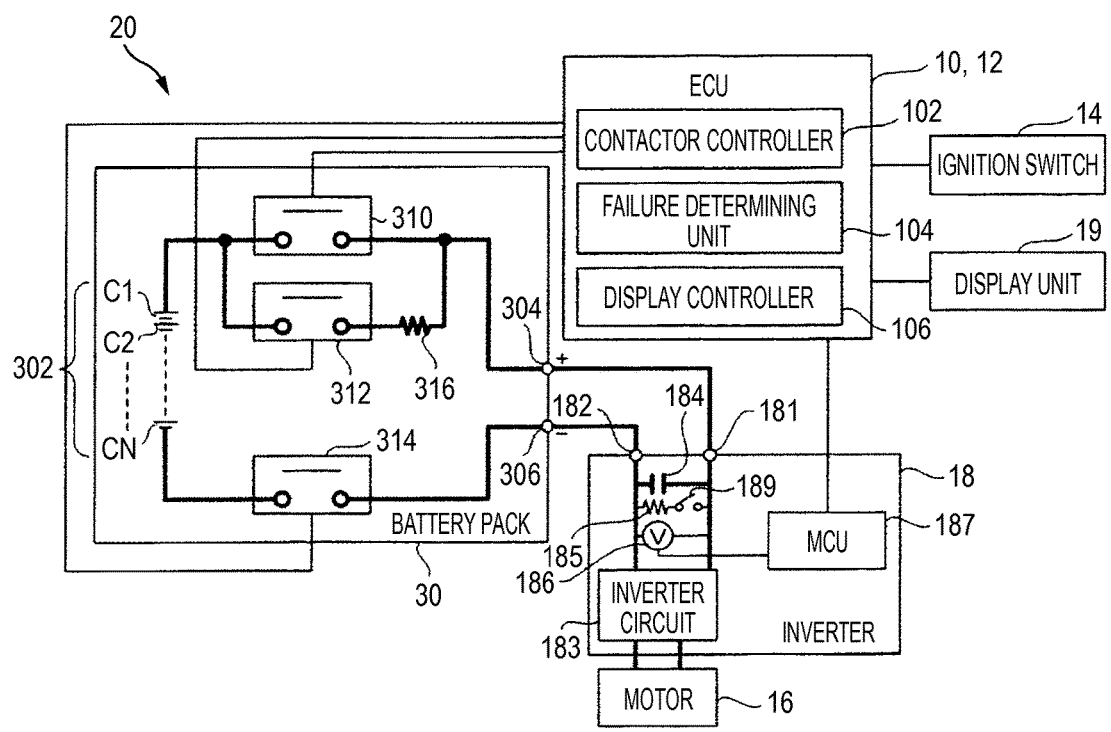
FIG. 1 is an explanatory view illustrating a configuration of an electric vehicle on which a contactor failure determining device is mounted.

FIG. 1 is an explanatory view illustrating a configuration of an electric vehicle 20 on which a contactor failure determining device 10 is mounted.

The contactor failure determining device 10 according to the embodiment is realized when a failure determining process described later is performed by a vehicle electronic control unit (ECU) 12 of an electric vehicle 20.

In the present embodiment, the electric vehicle 20 is a hybrid car that travels with power which is partially generated by a motor 16, and activation and deactivation of the electric vehicle 20 are realized by a driver operating on an ignition switch 14.

A battery pack 30 is mounted on the electric vehicle 20 as a driving power supply of the motor 16.

The battery pack 30 includes a multi-cell battery 302 in which a plurality of battery cells C1 to Cn are connected in series and which is accommodated in a single housing. A battery positive terminal 304 connected to a positive side of the multi-cell battery 302 and a battery negative terminal 306 connected to a negative side of the multi-cell battery 302 are provided outside the housing of the battery pack 30. A positive electrode of a load (an inverter 18 in the present embodiment) to which the multi-cell battery 302 supplies electric power is connected to the battery positive terminal 304 and a negative electrode of the load is connected to the battery negative terminal 306.

The multi-cell battery 302 is a high-voltage power supply, and in the present embodiment, the battery voltage is 300 V.

A positive-side contactor 310 and a precharge contactor 312 are provided in parallel between the battery positive terminal 304 of the battery pack 30 and the positive electrode of the multi-cell battery 302. A negative-side contactor 314 is provided between the battery negative terminal 306 of the battery pack 30 and the negative electrode of the multi-cell battery 302.

That is, the battery pack 30 includes the positive-side contactor 310 provided between the positive electrode of the multi-cell battery 302 and the positive electrode (an inverter positive terminal 181) of the load to which the multi-cell battery 302 supplies electric power, the precharge contactor 312 provided between the multi-cell battery 302 and the load, and the negative-side contactor 314 provided between the negative electrode of the multi-cell battery 302 and a negative electrode (an inverter negative terminal 182) of the load.

In the present embodiment, although the precharge contactor 312 is provided in parallel to the positive-side contactor 310, the precharge contactor 312 may be provided in parallel to the negative-side contactor 314.

The positive-side contactor 310 and the negative-side contactor 314 are provided so as to cut electrical connection between the load and the multi-cell battery 302.

The precharge contactor 312 is closed before the positive-side contactor 310 is closed in order to prevent abrupt application of a high voltage to the positive-side contactor 310 when the multi-cell battery 302 and the inverter 18 are connected. More specifically, the precharge contactor 312 is connected in series to a limiting resistor 316, and current flowing on a circuit is limited in a state in which the precharge contactor 312 and the negative-side contactor 314 are closed. At the start of supply of high-voltage power in the electric vehicle 20, first, the precharge contactor 312 and the negative-side contactor 314 are closed so that the voltage of a capacitor 184 is controlled (precharged) to be the same as the battery voltage by the limited current. After that, the positive-side contactor 310 is closed and the precharge contactor 312 is opened whereby the process of supplying high-voltage power to the electric vehicle 20 is completed.

The contactor failure determining device 10 determines the presence of failures (fixing by melting) in the positive-side contactor 310, the precharge contactor 312, and the negative-side contactor 314.

The motor 16 is driven by electric power supplied from the battery pack 30.

More specifically, the inverter 18 that converts DC current to AC current is provided between the motor 16 and the battery pack 30, and AC current converted by the inverter 18 is supplied to the motor 16.

Thus, in the present embodiment, the load to which the battery pack 30 supplies electric power is the inverter 18.

The inverter 18 includes the inverter positive terminal 181 connected to the battery positive terminal 304 of the battery pack 30, the inverter negative terminal 182 connected to the battery negative terminal 306 of the battery pack 30, an inverter circuit 183 connected to the inverter positive terminal 181 and the inverter negative terminal 182, the capacitor 184 connected to the inverter positive terminal 181 and the inverter negative terminal 182 in parallel to the inverter circuit 183, a discharge resistor 185, a discharge switch 189, a voltmeter 186, and a motor control unit (MCU) 187.

The inverter circuit 183 is configured to include a switching element and converts DC current to AC current by switching. The inverter circuit 183 converts regenerative power (AC current) generated by the motor 16 during deceleration of the electric vehicle 20 to DC current and supplies the DC current to the battery pack 30.

The capacitor 184 is provided to smooth noise generated by the switching in the inverter circuit 183.

The discharge resistor 185 is provided to discharge electric charges stored in the capacitor 184 at the end of supply of high-voltage power to the electric vehicle 20.

The discharge switch 189 is opened and closed by the vehicle ECU 12 or the like. More specifically, the discharge switch 189 is a normally open contact and no current flows to the discharge resistor 185 in a normal state. On the other hand, when it is necessary to discharge the electric charges of the capacitor 184 at the end of supply of high-voltage power, a discharge request is output from the vehicle ECU 12 or the like and the discharge switch 189 is closed. In this way, current flows to the discharge resistor 185 and the electric charges stored in the capacitor 184 are discharged.

The voltmeter 186 is connected in parallel to the capacitor 184 so as to measure the voltage of the capacitor 184.

The MCU 187 controls the inverter circuit 183 according to an output request transmitted from the vehicle ECU 12 to the motor 16. The MCU 187 transmits the voltage of the capacitor 184 measured by the voltmeter 186 to the vehicle ECU 12. Communication between the MCU 187 and the vehicle ECU 12 is performed according to the CAN communication protocol.

The vehicle ECU 12 is a controller that controls the entire electric vehicle 20 and is configured to include a CPU, a ROM that stores a control program and the like, a RAM serving as a work area of the control program, an EEPROM that rewritably stores various types of data, and an interface unit that interfaces with peripheral circuits and the like.

The vehicle ECU 12 realizes a contactor controller 102, a failure determining unit 104, and a display controller 106 when the CPU executes the control program.

The contactor controller 102 outputs a control signal for switching the opening and closing of the positive-side contactor 310, the precharge contactor 312, and the negative-side contactor 314.

The failure determining unit 104 determines the presence of failures (fixing by melting) of the positive-side contactor 310, the precharge contactor 312, and the negative-side contactor 314 based on the states of the contactors controlled by the contactor controller 102 and a load voltage, that is, the voltage of the inverter 18 output from the voltmeter 186.

A specific operation of the contactor controller 102 and the failure determining unit 104 will be described in detail with reference to FIG. 2 and the subsequent drawings.

When the failure determining unit 104 determines that a failure has occurred in a contactor, the display controller 106 displays information on a display unit 19, notifying that a failure has occurred.

The display unit 19 is provided in a visible range (near a dashboard or the like) of the driver in the electric vehicle 20 and displays icons, messages, and the like according to the control of the display controller 106.

The notification transmitted when a failure occurs in a contactor is not limited to a method of displaying information on the display unit 19, but various conventionally known notification methods such as output of an audible sound may be used.

In the present embodiment, although the vehicle ECU 12 realizes the contactor failure determining device, the contactor failure determining device may be realized by other controllers mounted on the electric vehicle 20 such as a battery magnet member unit (BMU) that controls the battery pack 30 or the MCU 187.

The vehicle ECU 12, the MCU 187, and the display unit 19 are driven by electric power stored in an auxiliary battery (not illustrated) provided separately from the battery pack 30. The auxiliary battery is provided to drive various auxiliary devices in the electric vehicle 20 and is a battery having a lower voltage (for example, 12 V) than the battery pack 30. That is, the contactor failure determining device 10 is driven using a power supply system different from the high-voltage power supply that is supplied with electric power from the battery pack 30.

Details of Contactor Failure Determining Method

Next, the details of a failure determining method by the contactor failure determining device 10 will be described.

The contactor failure determining device 10 determines the presence of failures in the precharge contactor 312 and the positive-side contactor 310 at the deactivation (the end of supply of high-voltage power) of the electric vehicle 20 and the presence of failures in the negative-side contactor 314 at the activation (the start of supply of high-voltage power) of the electric vehicle 20.

Thus, in the following description, the process at the start of supply of high-voltage power and the process at the end of supply of high-voltage power will be described separately.

Failure Determination at End of Supply of High-Voltage Power

Figure 2:
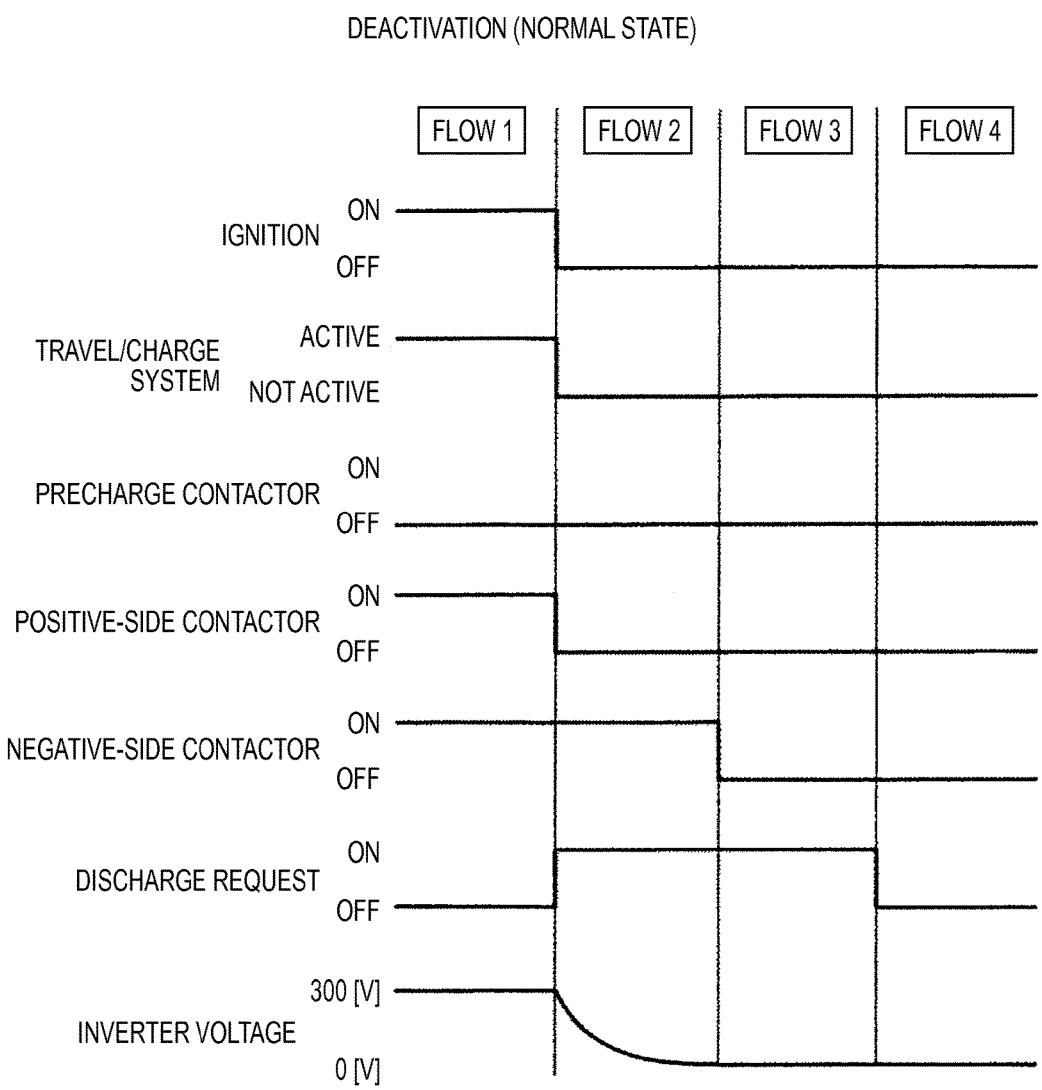
FIG. 2 is a timing chart illustrating a failure determining process at the end of supply of high-voltage power.
Figure 3:
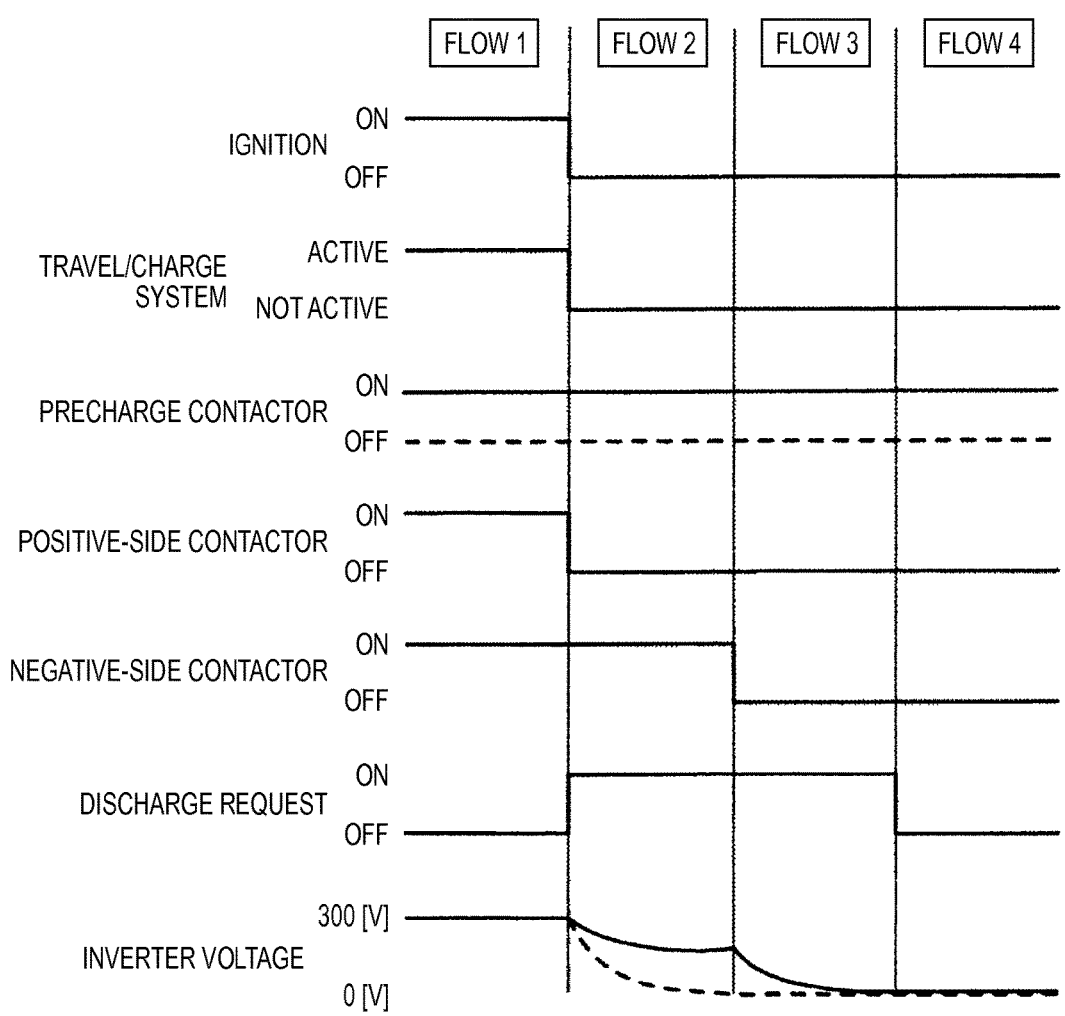
FIG. 3 is a timing chart illustrating a failure determining process at the end of supply of high-voltage power.
Figure 4:
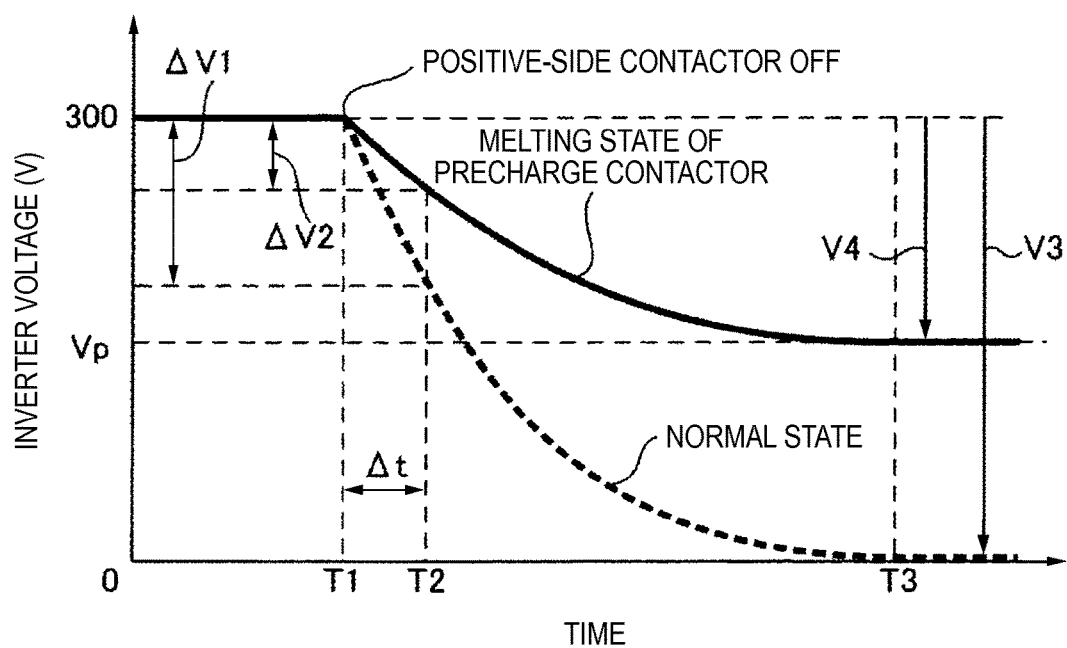
FIG. 4 is a timing chart illustrating a failure determining process at the end of supply of high-voltage power.
Figure 5:
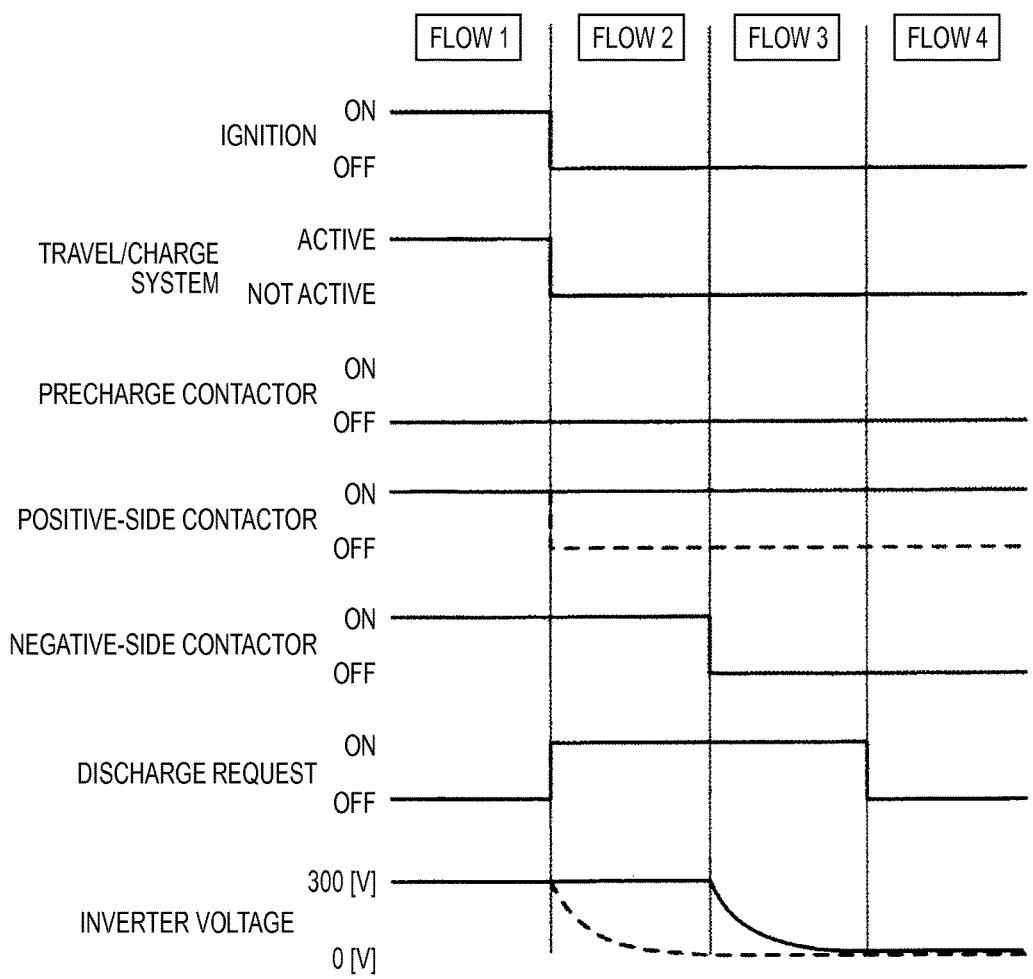
FIG. 5 is a timing chart illustrating a failure determining process at the end of supply of high-voltage power.

FIGS. 2 to 5 are timing charts illustrating a failure determining process of the contactor failure determining device 10 at the end of supply of high-voltage power. FIG. 2 illustrates a normal state in which fixing by melting does not occur in any contactor, FIG. 3 illustrates a failure state in which fixing by melting occurs in the precharge contactor 312, and FIG. 5 illustrates a failure state in which fixing by melting occurs in the positive-side contactor 310.

The timing charts of FIGS. 2, 3, and 5 are divided into Flow 1 to Flow 4 in a time-sequential order and illustrate, from top to down, the state of the ignition switch 14, the state of a travel/charge system of the electric vehicle 20, the state of the precharge contactor 312, the state of the positive-side contactor 310, the state of the negative-side contactor 314, the presence of a discharge request for discharging the capacitor 184 of the inverter 18, and an inverter voltage (the voltage of the inverter 18 measured by the voltmeter 186).

First, the normal state in which fixing by melting does not occur in any contactor will be described with reference to FIG. 2.

In the state illustrated in FIG. 2, a contactor control signal transmitted from the contactor controller 102 is identical to the actual state of the contactor and the two states are depicted by solid lines.

In an initial state of Flow 1, the ignition switch 14 is turned on, the travel/charge system of the electric vehicle 20 is active, the precharge contactor 312 is open, the positive-side contactor 310 is closed, the negative-side contactor 314 is closed, the discharge request is turned off, the inverter voltage is 300 V which is the battery voltage of the multi-cell battery 302.

That is, a control state in which the positive-side contactor 310 and the negative-side contactor 314 are closed and the precharge contactor 312 is open is created.

Flow 1 proceeds to Flow 2 when the driver turns the ignition switch 14 off. That is, the travel/charge system of the electric vehicle 20 is not active and the discharge request for discharging the capacitor 184 of the inverter 18 is turned on.

The contactor failure determining device 10 outputs a control signal for switching the positive-side contactor 310 to an open state from the contactor controller 102. That is, in a state in which a control signal for controlling the positive-side contactor 310 and the negative-side contactor 314 to a closed state and the precharge contactor 312 to an open state is output, a first contactor control step of outputting a control signal for switching the positive-side contactor 310 to an open state at the end of supply of high-voltage power is executed.

As a result, the positive-side connection between the multi-cell battery 302 and the inverter 18 is cut, the electric charges stored in the capacitor 184 of the inverter 18 are consumed by the discharge resistor 185, and the inverter voltage starts decreasing.

The failure determining unit 104 of the contactor failure determining device 10 executes a fixing determining step of determining the presence of fixing by melting in the precharge contactor 312 based on the degree of voltage drop at that time (that is, the degree of voltage drop of the voltage applied to the load after the control signal for switching the positive-side contactor 310 to an open state is output).

In FIG. 2, since fixing by melting does not occur in any contactor, the inverter voltage decreases with time and finally reaches 0 V. That is, a state in which the load voltage after the control signal for switching the positive-side contactor 310 to an open state is output has dropped a second predetermined amount (described later) or more per unit period or a state in which a final voltage drop amount is a fourth predetermined amount (described later) or more is created.

When the inverter voltage having started decreasing in Flow 2 decreases to approximately 0 V, Flow 2 proceeds to Flow 3 and the contactor controller 102 executes a second contactor control step of outputting a control signal for switching the negative-side contactor 314 to an open state.

After that, the discharge request is turned off (Flow 4), and the process of deactivating the electric vehicle 20 is completed.

Next, a failure state in which fixing by melting occurs in the precharge contactor 312 will be described with reference to FIG. 3.

In the state illustrated in FIG. 3, the contactor control signal transmitted from the contactor controller 102 is not identical to the actual state of the precharge contactor 312, and the contactor control signal at that time is depicted by a dot line.

In FIG. 3, the inverter voltage when fixing by melting occurs in the precharge contactor 312 is depicted by a solid line, and the inverter voltage (see FIG. 2) in a normal state is depicted by a dot line for comparison.

When fixing by melting occurs in the precharge contactor 312, although the precharge contactor control signal (dot line) transmitted from the contactor controller 102 indicates an open state, the actual state (solid line) of the precharge contactor is a closed state.

In FIG. 3, the degree of voltage drop after the positive-side contactor 310 is controlled to an open state in Flow 2 is smaller than that in the normal state illustrated in FIG. 2. That is, as compared to the inverter voltage in the normal state indicated by a dot line, the voltage drop amount per unit period of the inverter voltage in Flow 2 is small and a final stable voltage does not reach 0 V.

This is because, when the precharge contactor 312 melts, a closed circuit is formed by the precharge contactor 312 between the multi-cell battery 302 and the inverter 18 even after the positive-side contactor 310 is controlled to an open state, and current is supplied to the inverter 18.

The reason why the voltage in Flow 2 decreases further than that when the positive-side contactor 310 is in a closed state (Flow 1) is because the limiting resistor 316 is connected to the precharge contactor 312, and the amount of current when current flows through the precharge contactor 312 is smaller than that when current flows through the positive-side contactor 310.

The final inverter voltage (after the elapse of a predetermined period as below) in Flow 2 is the voltage divided by the discharge resistor 185 and the limiting resistor 316.

Using such a difference in the degree of voltage drop, the contactor failure determining device 10 determines fixing by melting of the precharge contactor 312 in the fixing determining step using any one of the following two methods.

Method 1

It is determined that the precharge contactor 312 is fixed in the closed state when the voltage drop amount per unit period after a control signal for switching the positive-side contactor 310 to an open state is output is equal to or larger than a first predetermined value and is smaller than a second predetermined value which is larger than the first predetermined value.

Method 2

It is determined that the precharge contactor 312 fixes in the closed state when a voltage drop amount of a load after the elapse of a predetermined period after a control signal for switching the positive-side contactor 310 to an open state is output is equal to or larger than a third predetermined value and is smaller than a fourth predetermined value which is larger than the third predetermined value.

FIG. 4 is an enlarged view of a portion near Flow 2 of FIG. 3.

In FIG. 4, the inverter voltage which is 300 V at an initial state starts decreasing after the positive-side contactor 310 is controlled to an open state at time T1 and reaches a stable voltage at time T3 (the stable voltage is 0 V in a normal state and is Vp (>0 V) in a fixing state of the precharge contactor 312).

According to Method 1, the voltage drop amount $\Delta V/t$ per unit period of the inverter voltage after the positive-side contactor 310 is controlled to an open state at time T1 is calculated, and it is determined that the precharge contactor 312 is fixed in the closed state by melting when the value is equal to or larger than the first predetermined value and is smaller than the second predetermined value which is larger than the first predetermined value.

Although the first and second predetermined values are determined appropriately based on discharge characteristics or the like of the inverter 18, at least the first predetermined value is set to a value larger than a voltage drop amount (0 or very small value) per unit period in a fixing state of the positive-side contactor 310, which will be described later. The second predetermined value is set to a value smaller than a voltage drop amount $\Delta V1/t$ per unit period in a normal state.

In FIG. 4, $\Delta V/t = \Delta V2/t$ ($<\Delta V1/t$) is established in the fixing state of the precharge contactor.

When the presence of fixing by melting of the precharge contactor 312 is determined according to Method 1, determination can be made in the process (for example, time T2) in which the inverter voltage is decreasing after the positive-side contactor 310 is controlled to an open state. Thus, the time taken to complete the determination can be shortened.

According to Method 2, a period (for example, the period of T3–T1) taken until the inverter voltage drops after the positive-side contactor 310 is controlled to an open state is set as a predetermined period, and it is determined that the precharge contactor 312 fixes in the closed state by melting when the amount of voltage drop of the inverter voltage after the elapse of the predetermined period is equal to or larger than a third predetermined value and is smaller than a fourth predetermined value which is larger than the third predetermined value.

Although the third and fourth predetermined values are determined appropriately based on discharge characteristics or the like of the inverter 18, at least the third predetermined value is set to a value larger than a voltage drop amount (0 or very small value) in a fixing state of the positive-side contactor 310, which will be described later. At least the fourth predetermined value is set to a value smaller than a voltage drop amount V3 ($\approx$300 V) in a normal state.

In FIG. 4, the voltage drop amount V4 (<V3) is established in the fixing state of the precharge contactor.

When the presence of the fixing by melting of the precharge contactor 312 is determined according to Method 2, since determination is made after the voltage obtained after the positive-side contactor 310 is controlled to an open state is stabilized, although the time taken to complete the determination increases as compared to Method 1, a stable determination result can be obtained.

Thus, which one of Method 1 and Method 2 will be employed is determined based on the characteristics or the like of the electric vehicle 20 and the load.

For example, in the case of the electric vehicle 20 in which the discharge speed of a load is relatively fast, since the time taken until the voltage after voltage drop is stabilized is relatively short, Method 2 which provides a stable determination result may be employed. On the other hand, in the case of the electric vehicle 20 in which the discharge speed of a load is relatively slow, Method 1 which provides a determination result quickly in the process in which the voltage decreases may be employed.

Returning to FIG. 3, when it is determined that the precharge contactor 312 fixes in the closed state, the contactor failure determining device 10 proceeds to Flow 3 and controls the negative-side contactor 314 to an open state. When the negative-side contactor 314 is opened, the inverter voltage starts decreasing. When the inverter voltage reaches 0 V, the discharge request is turned off (Flow 4), and the process of deactivating the electric vehicle 20 is completed.

When it is determined that the precharge contactor 312 fixes in the closed state, the contactor failure determining device 10 causes the display controller 106 to display information indicating a failure in a contactor on the display unit 19 to inform the driver or the like of failures in the precharge contactor 312.

Next, a failure state in which fixing by melting occurs in the positive-side contactor 310 will be described with reference to FIG. 5.

When the positive-side contactor 310 melts and fixes in the closed state, the positive-side contactor 310 is not opened even after a control signal for switching the positive-side contactor 310 to an open state is output in Flow 2. Thus, the connection between the inverter 18 and the multi-cell battery 302 is not cut, and the voltage rarely drops even when the capacitor 184 is discharged.

Thus, the contactor failure determining device 10 determines that the positive-side contactor 310 has melted and fixed when the inverter voltage rarely decreases even after a control signal for switching the positive-side contactor 310 to an open state is output, that is, when the voltage drop amount per unit period after the control signal for switching the positive-side contactor 310 to an open state is output is smaller than the first predetermined value, or when the voltage drop amount of the load after the elapse of a predetermined period after the control signal for switching the positive-side contactor 310 to an open state is output is smaller than the third predetermined value.

In this manner, the contactor failure determining device 10 can determine the presence of fixing by melting of the precharge contactor 312 and the presence of fixing by melting of the positive-side contactor 310 based on the degree of voltage drop of the voltage applied to the load after the positive-side contactor 310 is opened at the end of supply of high-voltage power.

When the presence of the melting and fixing of the positive-side contactor 310 is determined, a fifth predetermined value may be used instead of the first predetermined value. Also, a sixth predetermined value may be used instead of the third predetermined value. In this case, the contactor failure determining device 10 determines that the positive-side contactor 310 has melted and fixed when the inverter voltage rarely decreases even after a control signal for switching the positive-side contactor 310 to an open state is output, that is, when the voltage drop amount per unit period after the control signal for switching the positive-side contactor 310 to an open state is output is smaller than the fifth predetermined value, or when the voltage drop amount of the load after the elapse of a predetermined period after the control signal for switching the positive-side contactor 310 to an open state is output is smaller than the sixth predetermined value.

When it is determined that the positive-side contactor 310 has melted and fixed, the contactor failure determining device 10 proceeds to Flow 3 to control the negative-side contactor 314 to an open state. When the negative-side contactor 314 is opened, the inverter voltage starts decreasing. When the inverter voltage reaches 0 V, the discharge request is turned off (Flow 4), and the process of ending the supply of high-voltage power to the electric vehicle 20 is completed.

When it is determined that the positive-side contactor 310 has melted and fixed, the contactor failure determining device 10 displays information indicating a failure in a contactor on the display unit 19 to inform the driver or the like of failures in the positive-side contactor 310 similarly to the case of the precharge contactor 312.

Failure Determination at Start of Supply of High-Voltage Power

Next, determination of fixing by melting of the negative-side contactor 314 at the activation (start of supply of high-voltage power) of the electric vehicle 20 will be described.

Figure 6:
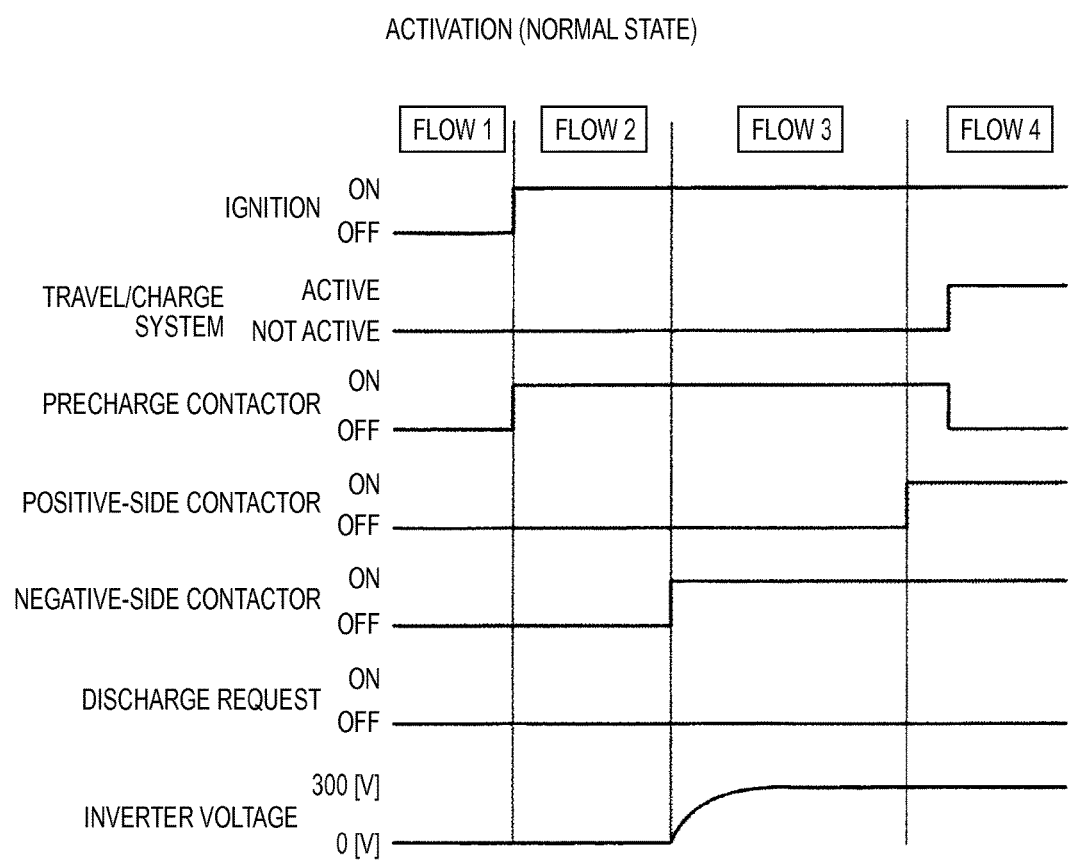
FIG. 6 is a timing chart illustrating a failure determining process at the start of supply of high-voltage power.
Figure 7:
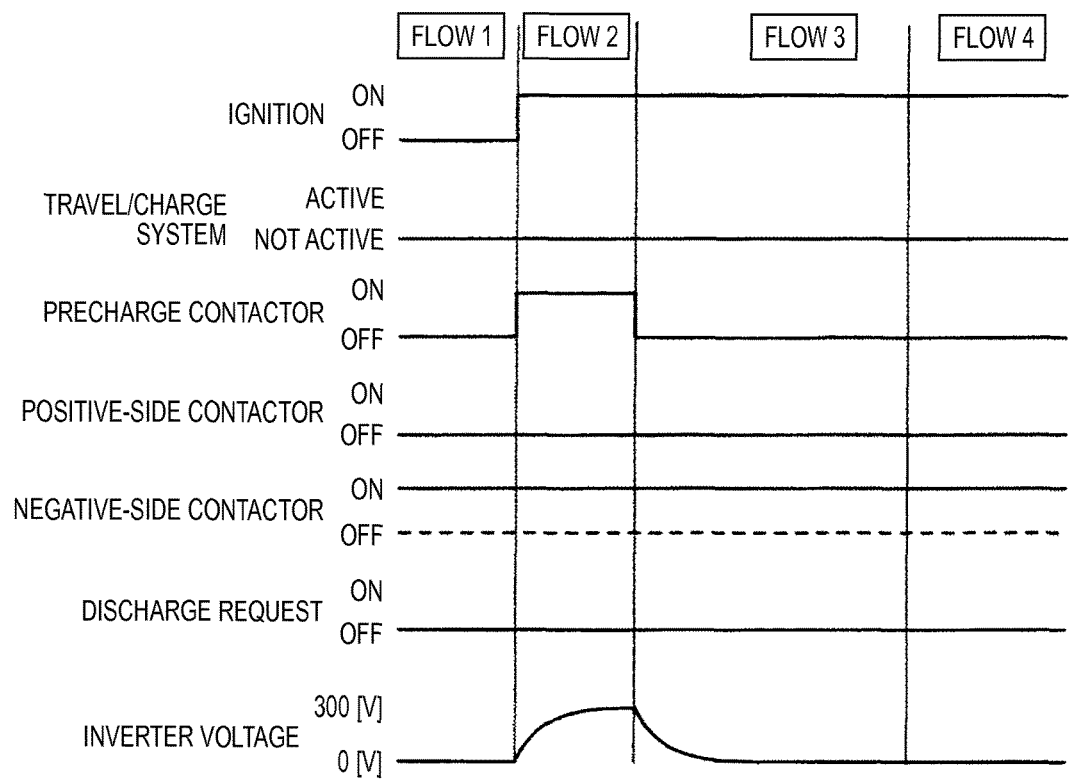
FIG. 7 is a timing chart illustrating a failure determining process at the start of supply of high-voltage power.

FIGS. 6 and 7 are timing charts illustrating a failure determining process of the contactor failure determining device 10 at the start of supply of high-voltage power. FIG. 6 illustrates a normal state in which fixing by melting does not occur in any contactor and FIG. 7 illustrates a failure state in which fixing by melting occurs in the negative-side contactor 314.

The timing charts of FIGS. 6 and 7 are divided into Flow 1 to Flow 4 in a time-sequential order similarly to FIG. 2 and the like, and illustrate, from top to down, the state of the ignition switch 14, the state of a travel/charge system of the electric vehicle 20, the state of the precharge contactor 312, the state of the positive-side contactor 310, the state of the negative-side contactor 314, the presence of a discharge request for discharging the capacitor 184 of the inverter 18, and an inverter voltage.

First, the normal state in which fixing by melting does not occur in any contactor will be described with reference to FIG. 6.

In the state illustrated in FIG. 6, a contactor control signal transmitted from the contactor controller 102 is identical to the actual state of the contactor and the two states are depicted by solid lines.

In an initial state of Flow 1, the electric vehicle 20 is not active, the ignition switch 14 is turned off, the travel/charge system of the electric vehicle 20 is not active, the precharge contactor 312 is open, the positive-side contactor 310 is open, the negative-side contactor 314 is open, the discharge request is turned off, the inverter voltage is 0 V.

When the driver turns the ignition switch 14 on, Flow 1 proceeds to Flow 2 and the contactor controller 102 of the contactor failure determining device 10 outputs a control signal for switching the precharge contactor 312 to a closed state. That is, in a state in which a control signal for controlling the positive-side contactor 310, the precharge contactor 312, and the negative-side contactor 314 to an open state is output, a third contactor control step of outputting a control signal for switching the precharge contactor 312 to a closed is executed.

The failure determining unit 104 of the contactor failure determining device 10 executes a second fixing determining step of determining the presence of fixing by melting of the negative-side contactor 314 based on the degree of voltage rise of the voltage applied to the load after the control signal for switching the precharge contactor 312 to a closed state is output.

In FIG. 6, since the inverter voltage does not rise even after the precharge contactor 312 is switched to the closed state, it is determined that the negative-side contactor 314 is not fixed in the closed state.

Subsequently, the contactor failure determining device 10 proceeds from Flow 2 to Flow 3 and the contactor controller 102 outputs a control signal for switching the negative-side contactor 314 to a closed state.

As a result, a closed circuit is formed between the multi-cell battery 302 and the inverter 18 by the precharge contactor 312 and the negative-side contactor 314 and the inverter voltage starts rising.

When the inverter voltage reaches approximately 300 V which is the battery voltage of the multi-cell battery 302, Flow 3 proceeds to Flow 4 and the contactor controller 102 outputs a control signal for switching the positive-side contactor 310 to a closed state.

After that, when the contactor controller 102 outputs a control signal for switching the precharge contactor 312 to an open state, the travel/charge system of the electric vehicle 20 is activated (Active) and the process of activating the electric vehicle 20 is completed.

That is, after the control signal for switching the positive-side contactor 310 to a closed state is output, a fourth contactor control step of outputting a control signal for switching the precharge contactor 312 to an open state is executed.

In the present embodiment, the fourth contactor control step is performed only when it is determined in the second fixing determining step that the negative-side contactor 314 has not melted and fixed, and the activating process is stopped when it is determined in the second fixing determining step that the negative-side contactor 314 has melted and fixed, which will be described later.

Next, a failure state in which fixing by melting occurs in the negative-side contactor 314 will be described with reference to FIG. 7.

In the state illustrated in FIG. 7, the contactor control signal transmitted from the contactor controller 102 is not identical to the actual state of the negative-side contactor 314, and the contactor control signal at that time is depicted by a dot line. That is, when fixing by melting occurs in the negative-side contactor 314, although the control signal (dot line) transmitted from the contactor controller 102 to the negative-side contactor 314 indicates an open state, the actual state (solid line) of the negative-side contactor 314 is a closed state.

Thus, the precharge contactor 312 is closed in Flow 2, a closed circuit is formed between the multi-cell battery 302 and the inverter 18 by the precharge contactor 312 and the negative-side contactor 314, and the inverter voltage starts rising.

From the above, the contactor failure determining device 10 determines that the negative-side contactor 314 has melted and fixed when the load voltage rises after the control signal for switching the precharge contactor 312 to a closed state is output in Flow 2.

When it is determined that the negative-side contactor 314 has melted and fixed, the contactor failure determining device 10 stops the process of activating the electric vehicle 20 and outputs a control signal for controlling the precharge contactor 312 to an open state. When the precharge contactor 312 is opened, the inverter voltage decreases to reach 0 V.

The contactor failure determining device 10 causes the display controller 106 to display information indicating a failure in a contactor on the display unit 19 to inform the driver or the like of failures in the negative-side contactor 314.

Since electric power can be supplied to the inverter 18 even when a failure occurs in the negative-side contactor 314, the process of activating the electric vehicle 20 may be continued. In this case, it is preferable to display information indicating a failure in a contactor on the display unit 19 to inform the driver or the like of failures in the negative-side contactor 314.

Comparison with Technique in Related Art

Next, a difference between the contactor failure determining method of the technique in the related art and the contactor failure determining method of the present invention will be described.

In the contactor failure determining method of the conventional technique, the presence of failures in the positive-side contactor 310 only is determined at the deactivation (the end of supply of high-voltage power) of the electric vehicle 20, and the presence of failures in the precharge contactor 312 and the negative-side contactor 314 is determined at the activation (the start of supply of high-voltage power) of the electric vehicle 20. That is, the timing at which the presence of failures in the precharge contactor 312 is determined in the present invention is different from the timing in the conventional technique.

Figure 8:
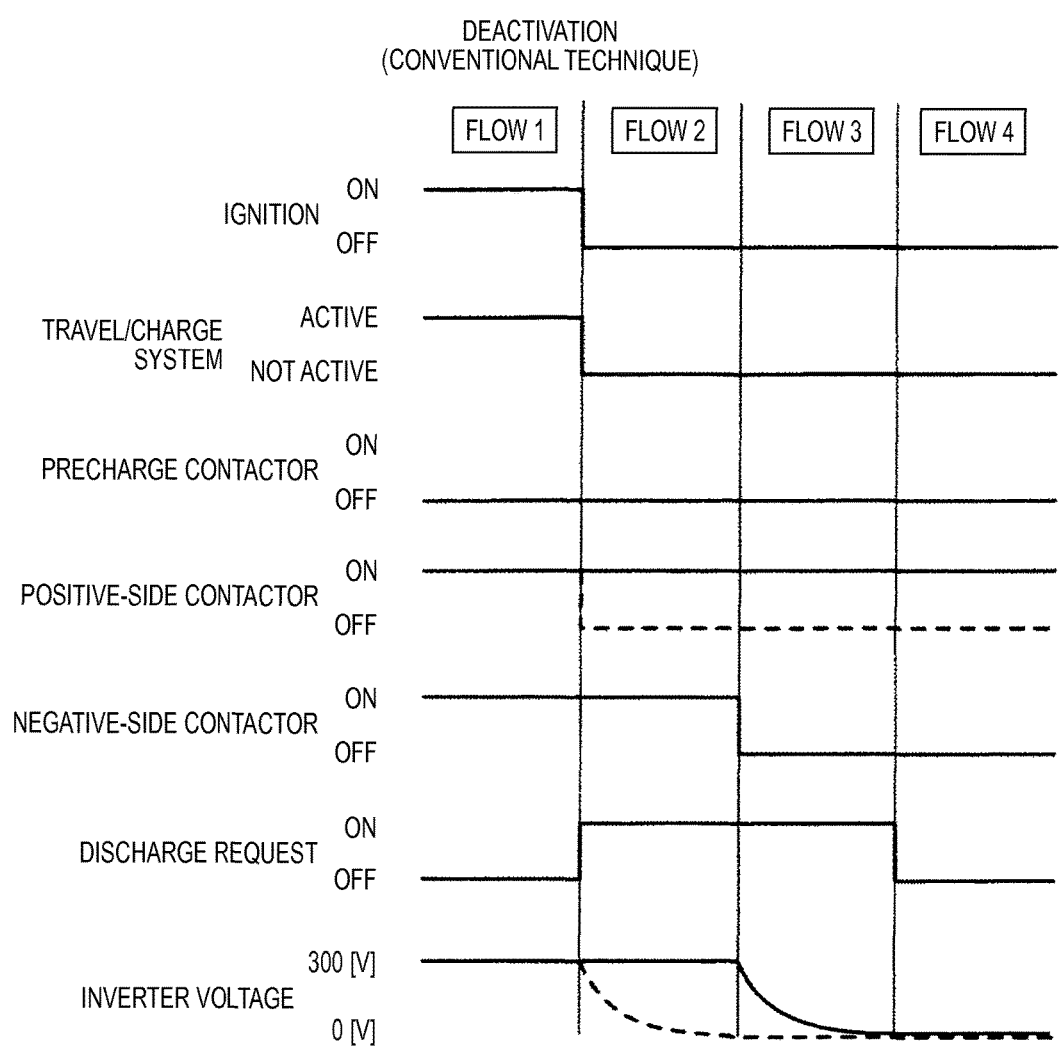
FIG. 8 is a timing chart illustrating a failure determining process at the end of supply of high-voltage power according to the conventional technique.

FIG. 8 is a timing chart illustrating a failure determining process at the end of supply of high-voltage power in the conventional technique.

The process at the end of supply of high-voltage power in the conventional technique is the same as the determination of fixing by melting of the positive-side contactor 310 illustrated in FIG. 5.

That is, when the positive-side contactor 310 melts and fixes, the positive-side contactor 310 is not opened but the inverter voltage remains at 300 V which is the battery voltage of the multi-cell battery 302 even after a control signal for switching the positive-side contactor 310 to an open state is output in Flow 2.

Thus, when the load voltage does not drop after the control signal for switching the positive-side contactor 310 to an open state is output, it is determined that the positive-side contactor 310 has melted and fixed.

When it is determined that the positive-side contactor 310 has melted and fixed, the process proceeds to Flow 3 to control the negative-side contactor 314 to an open state. When the negative-side contactor 314 is opened, the inverter voltage starts decreasing. When the inverter voltage reaches 0 V, the discharge request is turned off (Flow 4), and the process of deactivating the electric vehicle 20 is completed.

Figure 9:
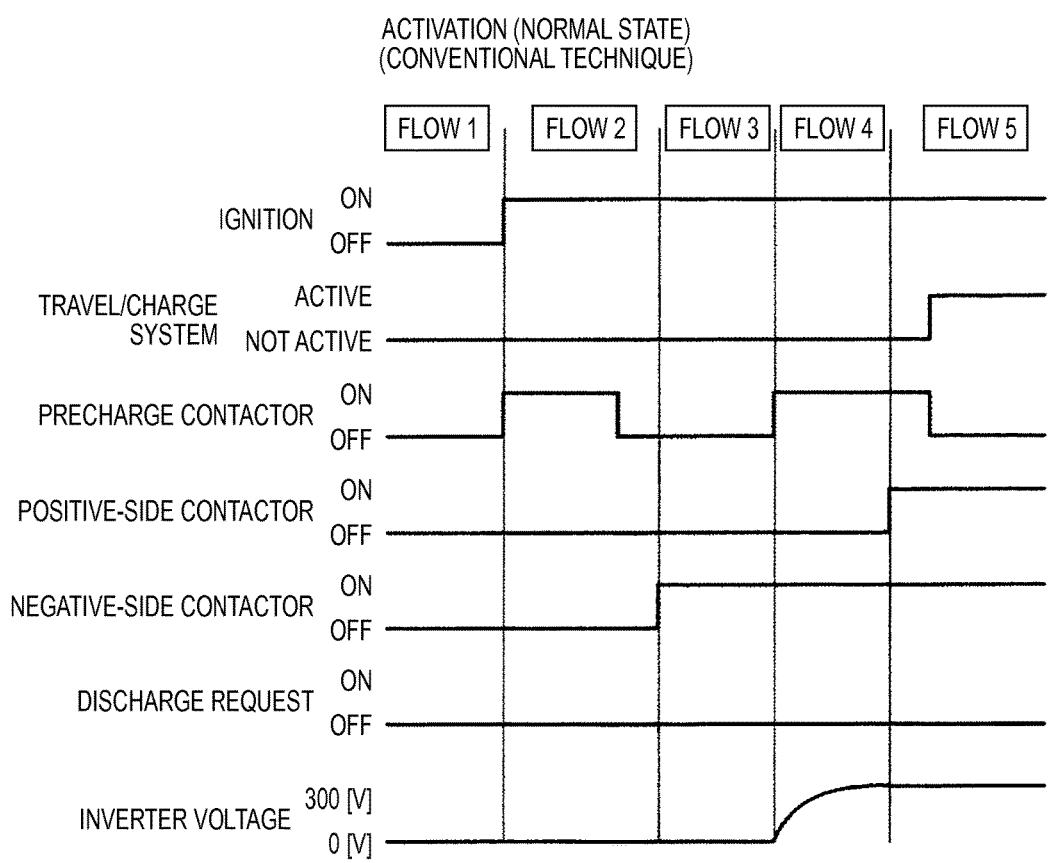
FIG. 9 is a timing chart illustrating a failure determining process at the start of supply of high-voltage power according to the conventional technique.

FIGS. 9 to 11 are timing charts illustrating a failure determining process at the start of supply of high-voltage power in the conventional technique. FIG. 9 illustrates a normal state in which fixing by melting does not occur in any contactor, and FIG. 10 illustrates a failure state in which fixing by melting occurs in the negative-side contactor 314, and FIG. 11 illustrates a failure state in which fixing by melting occurs in the precharge contactor 312.

First, the normal state in which fixing by melting does not occur in any contactor will be described with reference to FIG. 9.

In the state illustrated in FIG. 9, a contactor control signal transmitted from the contactor controller 102 is identical to the actual state of the contactor and the two states are depicted by solid lines.

In an initial state of Flow 1, the electric vehicle 20 is not active, the ignition switch 14 is turned off, the travel/charge system of the electric vehicle 20 is not active, the precharge contactor 312 is open, the positive-side contactor 310 is open, the negative-side contactor 314 is open, the discharge request is turned off, the inverter voltage is 0 V.

When the driver turns the ignition switch 14 on, Flow 1 proceeds to Flow 2 to output a control signal for switching the precharge contactor 312 to a closed state. This is to determine the presence of fixing by melting of the negative-side contactor 314, which will be described later.

When the inverter voltage does not rise even after the elapse of a predetermined period after the control signal for switching the precharge contactor 312 to a closed state is output, it is determined that the negative-side contactor 314 has not melted and fixed and a control signal for switching the precharge contactor 312 to an open state is output.

Subsequently, Flow 2 proceeds to Flow 3 to output a control signal for switching the negative-side contactor 314 to a closed state. As will be described later, in the conventional technique, the presence of fixing by melting of the precharge contactor 312 is determined based on a degree of voltage rise after the control signal for switching the negative-side contactor 314 to a closed state is output in Flow 3.

When the inverter voltage does not rise even after the elapse of a predetermined period after the control signal for switching the negative-side contactor 314 to a closed state is output, it is determined that the precharge contactor 312 has not melted and fixed, and Flow 3 proceeds to Flow 4 to output a control signal for switching the precharge contactor 312 to a closed state.

As a result, a closed circuit is formed between the multi-cell battery 302 and the inverter 18 by the precharge contactor 312 and the negative-side contactor 314 and the inverter voltage starts rising.

When the inverter voltage reaches approximately 300 V which is the battery voltage of the multi-cell battery 302, Flow 4 proceeds to Flow 5 to output a control signal for switching the positive-side contactor 310 to a closed state.

After that, a control signal for switching the precharge contactor 312 to an open state is output, the travel/charge system of the electric vehicle 20 is activated (Active) and the process of activating the electric vehicle 20 is completed.

Next, a failure state in which fixing by melting occurs in the negative-side contactor 314 will be described with reference to FIG. 10.

In the state illustrated in FIG. 10, the contactor control signal transmitted from the contactor controller 102 is not identical to the actual state of the negative-side contactor 314, and the contactor control signal at that time is depicted by a dot line. That is, when fixing by melting occurs in the negative-side contactor 314, although the control signal (dot line) transmitted from the contactor controller 102 to the negative-side contactor 314 indicates an open state, the actual state (solid line) of the negative-side contactor 314 is a closed state.

Thus, the precharge contactor 312 is closed in Flow 2, a closed circuit is formed between the multi-cell battery 302 and the inverter 18 by the precharge contactor 312 and the negative-side contactor 314, and the inverter voltage starts rising.

From the above, it is possible to determine that the negative-side contactor 314 has melted and fixed when the load voltage rises after the control signal for switching the precharge contactor 312 to a closed state is output.

After that, the activation process is stopped similarly to the present invention, for example.

Next, a failure state in which fixing by melting occurs in the precharge contactor 312 will be described with reference to FIG. 11.

In the state illustrated in FIG. 11, the contactor control signal transmitted from the contactor controller 102 is not identical to the actual state of the precharge contactor 312, and the contactor control signal at that time is depicted by a dot line. That is, the precharge contactor 312 is closed before the control signal of controlling the precharge contactor 312 to a closed state is output in Flow 2, and the precharge contactor 312 remains in the closed state even after the control signal for controlling the precharge contactor 312 to an open state is output.

Thus, at the same time as closing the negative-side contactor 314 in Flow 3, a closed circuit is formed between the multi-cell battery 302 and the inverter 18 by the precharge contactor 312 and the negative-side contactor 314, and the inverter voltage starts rising.

Accordingly, it is possible to determine that the precharge contactor 312 has melted and fixed when the load voltage rises after the control signal for switching the negative-side contactor 314 to a closed state is output in Flow 3.

After that, the activation process is stopped similarly to the present invention, for example.

When the contactor failure determining method according to the conventional technique is compared with the contactor failure determining method of the present invention, as illustrated in FIG. 9, in the contactor failure determining method according to the conventional technique, the precharge contactor 312 is switched to an open state in Flow 2 and the negative-side contactor 314 is switched to a closed state in Flow 3 in order to determine the presence of fixing by melting of the precharge contactor 312 at the start of supply of high-voltage power.

In contrast, in the contactor failure determining method of the present invention, as illustrated in FIG. 6, after the precharge contactor 312 is switched to a closed state in Flow 2, the negative-side contactor 314 is switched to a closed state without switching the precharge contactor 312 to an open state.

Thus, in the present invention, it is possible to shorten the activation period of the electric vehicle 20 by an amount corresponding to the latter half of Flow 2 and Flow 3 in FIG. 9 as compared to the conventional technique.

As described above, the contactor failure determining device 10 according to the embodiment outputs a control signal for switching the positive-side contactor 310 to an open state at the end of supply of high-voltage power from a state in which the positive-side contactor 310 and the negative-side contactor 314 are controlled to a closed state and the precharge contactor 312 is controlled to an open state and determines the presence of fixing by melting of the precharge contactor 312 based on the degree of voltage drop of the voltage applied to the load after the control signal is output.

Thus, it is possible to determine the presence of fixing by melting of the precharge contactor 312 at the time of performing an inevitable operation of controlling the positive-side contactor 310 to an open state at the end of supply of electric power to the load (the inverter 18) from the multi-cell battery 302 and to determine the presence of fixing by melting of the contactor quickly without closing or opening the contactor for the purpose of the fixing determination only.

Moreover, since the presence of fixing by melting of the negative-side contactor 314 is determined during precharge of the load at the start of supply of electric power from the multi-cell battery 302 to the load, it is possible to obviate the operation of closing or opening the contactor for the purpose of determining the presence of fixing by melting of contactors only and to start the supply of electric power from the multi-cell battery to the load quickly.

Further, since the contactor failure determining device 10 can determine the presence of fixing by melting of the positive-side contactor 310 together with the precharge contactor 312, it is possible to determine the presence of fixing by melting of contactors in a shorter period than when the presence of fixing by melting of the precharge contactor 312 and the presence of fixing by melting of the positive-side contactor are determined separately.

Further, when the contactor failure determining device 10 determines the presence of fixing by melting of the precharge contactor 312 based on the voltage drop amount of the load per unit period after the control signal of controlling the positive-side contactor to an open state is output, it is possible to determine the presence of fixing by melting of the precharge contactor 312 in the process in which the load voltage is dropping and to determine the presence of fixing by melting of the contactor in a short period.

Further, when the contactor failure determining device 10 determines the presence of fixing by melting of the precharge contactor 312 based on the voltage drop amount of the load after the elapse of a predetermined period after a control signal for controlling the positive-side contactor 310 to an open state is output, it is possible to determine the presence of fixing by melting of the precharge contactor 312 in a state in which the load voltage is stabilized (has dropped) and to determine the presence of fixing by melting of contactors with high accuracy.

Further, since the contactor failure determining device 10 determines that the positive-side contactor 310 melts and fixes when the load voltage has rarely dropped (has not dropped to a value lower than a predetermined value) after a control signal for controlling the positive-side contactor 310 to an open state is output, it is possible to determine which one of the positive-side contactor 310 and the precharge contactor 312 melts and fixes quickly.

Further, the presence of fixing by melting of the negative-side contactor 314 is determined based on the degree of voltage rise in the load after a control signal for switching the precharge contactor 312 to a closed state is output from a state in which a control signal for switching the positive-side contactor 310, the precharge contactor 312, and the negative-side contactor 314 to an open state at the start of supply of high-voltage power.

Thus, it is possible to determine the presence of fixing by melting of the negative-side contactor 314 at the time of performing an inevitable operation of switching the precharge contactor 312 to a closed state at the start of supply of high-voltage power. That is, it is possible to suppress complex operations and to shorten the activation period as compared to the conventional technique in which contactors are opened or closed for the purpose of determining the presence of fixing by melting of both the negative-side contactor and the precharge contactor at the start of supply of high-voltage power.

In the present embodiment, although the load to which the battery pack 30 supplies electric power is the inverter 18 only, a plurality of loads may be practically connected to the battery pack 30. For example, a front-wheel motor (first motor), a rear-wheel motor (second motor), and a power generator (third motor) may be mounted on the electric vehicle 20, and three inverters corresponding to the respective motors may be connected to the battery pack 30.

In this case, when a failure occurs in at least one of the plurality of loads, it may be difficult to discharge a capacitor by the failed load at the deactivation of the electric vehicle 20 and the load voltage may not drop.

Thus, in such a case, the degree of voltage drop used for determining the presence of failures in the precharge contactor 312 may be changed to a value smaller than a value used in a normal state.

That is, when a plurality of loads is connected to the multi-cell battery 302 (the battery pack 30) and a failure is detected in at least one of the plurality of loads, the first and second predetermined values or the third or fourth predetermined values may be set to a smaller value than that when a failure is not detected in the load.

By doing so, even when a failure occurs in a load connected to the battery pack 30 and discharge cannot be performed, it is possible to determine the presence of failures in the precharge contactor 312 accurately.

According to the contactor failure determining method in the embodiments, a control signal for switching the positive-side contactor to an open state is output at the end of supply of high-voltage power from a state in which the positive-side contactor and the negative-side contactor are controlled to a closed state and the precharge contactor is controlled to an open state, and the presence of fixing by melting of the precharge contactor is determined based on the degree of voltage drop of the voltage applied to the load after the control signal is output. Thus, it is possible to determine the presence of fixing by melting of the precharge contactor at the time of performing an inevitable operation of controlling the positive-side contactor to an open state at the end of supply of electric power to the load from the multi-cell battery and to determine the presence of fixing by melting of the contactor quickly without closing or opening the contactor for the purpose of the fixing determination only.

According to the contactor failure determining method in the embodiments, the presence of fixing by melting of the precharge contactor is determined based on the voltage drop amount of the load per unit period after the control signal of controlling the positive-side contactor to an open state is output. Thus, it is possible to determine the presence of fixing by melting of the precharge contactor in the process in which the load voltage is dropping and to determine the presence of fixing by melting of the contactor in a short period.

According to the contactor failure determining method in the embodiments, the presence of fixing by melting of the precharge contactor is determined based on the voltage drop amount of the load after the elapse of a predetermined period after the control signal for controlling the positive-side contactor to an open state is output. Thus, it is possible to determine the presence of fixing by melting of the precharge contactor in a state in which the load voltage is stabilized (has dropped) and to determine the presence of fixing by melting of contactors with high accuracy.

According to the contactor failure determining method in the embodiments, the presence of fixing by melting of the positive-side contactor together with the precharge contactor can be determined. Thus, it is possible to determine the presence of fixing by melting of contactors in a shorter period than when the presence of fixing by melting of the precharge contactor and the presence of fixing by melting of the positive-side contactor are determined separately.

According to the contactor failure determining method in the embodiments, it is determined that the positive-side contactor melts and fixes when the load voltage has rarely dropped (has not dropped to a value lower than a predetermined value) after the control signal for controlling the positive-side contactor to an open state is output. Thus, it is possible to determine which one of the positive-side contactor and the precharge contactor melts and fixes quickly.

According to the contactor failure determining method in the embodiments, the presence of fixing by melting of the negative-side contactor is determined based on the degree of voltage rise in the load after the control signal for switching the precharge contactor to a closed state is output from a state in which a control signal for switching the positive-side contactor, the precharge contactor, and the negative-side contactor to an open state at the start of supply of high-voltage power. Thus, it is possible to determine the presence of fixing by melting of the negative-side contactor at the time of performing an inevitable operation of switching the precharge contactor to a closed state at the start of supply of high-voltage power. That is, it is possible to suppress complex operations and to shorten the activation period as compared to the conventional technique in which contactors are opened or closed for the purpose of determining the presence of fixing by melting of both the negative-side contactor and the precharge contactor at the start of supply of high-voltage power.

According to the contactor failure determining method in the embodiments, when a plurality of loads is connected to the multi-cell battery and a failure is detected in at least one of the plurality of loads, a reference value (the first and second predetermined values or the third or fourth predetermined values) is set to a smaller value than that when a failure is not detected in the load. Thus, even when discharge cannot be performed due to failures, it is possible to determine the presence of failures in the precharge contactor accurately.

According to the contactor failure determining method in the embodiments, it is possible to determine the presence of fixing by melting of the precharge contactor at the time of controlling the positive-side contactor to an open state at the end of supply of electric power from the multi-cell battery to the load and to determine the presence of fixing by melting of the contactor quickly without closing or opening the contactor for the purpose of the fixing determination only. Moreover, since the presence of fixing by melting of the negative-side contactor is determined during precharge of the load at the start of supply of electric power from the multi-cell battery to the load, it is possible to obviate the operation of closing or opening the contactor for the purpose of determining the presence of fixing by melting of contactors only and to start the supply of electric power from the multi-cell battery to the load quickly.

According to the contactor failure determining device in the embodiments, a control signal for switching the positive-side contactor to an open state is output at the end of supply of high-voltage power from a state in which the positive-side contactor and the negative-side contactor are controlled to a closed state and the precharge contactor is controlled to an open state, and the presence of fixing by melting of the precharge contactor is determined based on the degree of voltage drop of the voltage applied to the load after the control signal is output. Thus, it is possible to determine the presence of fixing by melting of the precharge contactor at the time of performing an inevitable operation of controlling the positive-side contactor to an open state at the end of supply of electric power to the load from the multi-cell battery and to determine the presence of fixing by melting of the contactor quickly without closing or opening the contactor for the purpose of the fixing determination only.

What is claimed is:

1. A contactor failure determining device comprising:
   a contactor control unit that outputs a control signal for switching a positive-side contactor provided between a positive electrode of the multi-cell battery and a positive electrode of a load to which the multi-cell battery supplies electric power to an open state at the end of supply of high-voltage power from a state in which a control signal for controlling the positive-side contactor and a negative-side contactor provided between a negative electrode of the multi-cell battery and a negative electrode of the load to a closed state and a precharge contactor provided between the multi-cell battery and the load to an open state is output; and
   a determination unit that determines a presence of fixing of the precharge contactor based on a degree of voltage drop of a voltage applied to the load after the control signal for switching the positive-side contactor to the open state is output.

2. The contactor failure determining device according to claim 1, wherein
   the determining unit determines that the precharge contactor is fixed in the closed state when a voltage drop amount per unit period of the load after the control signal for switching the positive-side contactor to the open state is output is equal to or larger than a first predetermined value and is smaller than a second predetermined value which is larger than the first predetermined value.

3. The contactor failure determining device according to claim 2, wherein
   the determining unit further determines that the positive-side contactor is fixed in a closed state when the voltage drop amount per unit period after the control signal for switching the positive-side contactor to the open state is output is smaller than a third predetermined value or when the voltage drop amount of the load after elapse of the predetermined period after the control signal for switching the positive-side contactor to the open state is output is smaller than a fourth predetermined value.

4. The contactor failure determining device according to claim 3, wherein
   a plurality of loads are connected to the multi-cell battery, and
   the determining unit sets the third and fourth predetermined values to values smaller than those when a failure is not detected in the load, when the failure is detected in at least one of the plurality of loads.

5. The contactor failure determining device according to claim 2, wherein
   a plurality of loads are connected to the multi-cell battery, and
   the determining unit sets the first and second predetermined values to values smaller than those when a failure is not detected in the load, when the failure is detected in at least one of the plurality of loads.

6. The contactor failure determining device according to claim 1, wherein
   the determining unit determines that the precharge contactor is fixed in the closed state when a voltage drop amount of the load after elapse of a predetermined period after the control signal for switching the positive-side contactor to the open state is output is equal to or larger than a first predetermined value and is smaller than a second predetermined value which is larger than the first predetermined value.

7. The contactor failure determining device according to claim 6, wherein
   a plurality of loads are connected to the multi-cell battery, and
   the determining unit sets the first and second predetermined values to values smaller than those when a failure is not detected in the load, when the failure is detected in at least one of the plurality of loads.

8. The contactor failure determining device according to claim 1, wherein
   the determining unit further determines a presence of fixing of the positive-side contactor as well as the presence of fixing of the precharge contactor based on a degree of voltage drop of the voltage applied to the load after the control signal for switching the positive-side contactor to the open state is output.

* * * * *